United States Patent [19]

Kenemuth

[11] Patent Number: 4,516,246
[45] Date of Patent: May 7, 1985

[54] DATA COMPRESSION SYSTEM

[75] Inventor: James A. Kenemuth, Palo Alto, Calif.

[73] Assignee: Prentice Corporation, Sunnyvale, Calif.

[21] Appl. No.: 352,681

[22] Filed: Feb. 26, 1982

[51] Int. Cl.$^3$ .............................................. H04N 7/12
[52] U.S. Cl. ................................ 375/37; 358/261; 340/347 R; 375/122
[58] Field of Search ............... 375/37, 25; 358/133, 358/135; 340/347 DD; 375/122

[56] References Cited

U.S. PATENT DOCUMENTS

| | | | |
|---|---|---|---|
| 3,560,639 | 2/1971 | Centanni | 358/261 |
| 4,168,513 | 9/1979 | Hains et al. | 358/261 |
| 4,228,467 | 10/1980 | De Loyle et al. | 358/261 |

OTHER PUBLICATIONS

Ismail et al., "Facsimile Compression Using a Classified Adaptive Block/Run-Length Coding Scheme", Conference NTC '80, IEEE National Telecommunications, Houston, TX, USA, Nov. 30–Dec. 4, 1980, p. 3638.
Usubuch et al., "Adaptive Predictive Coding for Newspaper Facsimile", Proceedings of IEEE, vol. 68, No. 7, Jul. 1980, pp. 807–813.

Primary Examiner—Robert L. Griffin
Assistant Examiner—Stephen Chin
Attorney, Agent, or Firm—Hamrick, Hoffman, Guillot & Kazubowski

[57] ABSTRACT

A character base input data stream is encoded in compressed form by using a histogram of a sample of the data stream to determine the frequency of appearance of characters in the stream. A code for a character $M+1$ is generated in an encoder (112) to be of a length which is an inverse function of the frequency of appearance of character $M+1$ in the preceding M characters in the sample. Decoding can be achieved by forming a comparable sample window in a decoder (118) to which is applied an estimated index of the incoming character being decoded.

21 Claims, 12 Drawing Figures

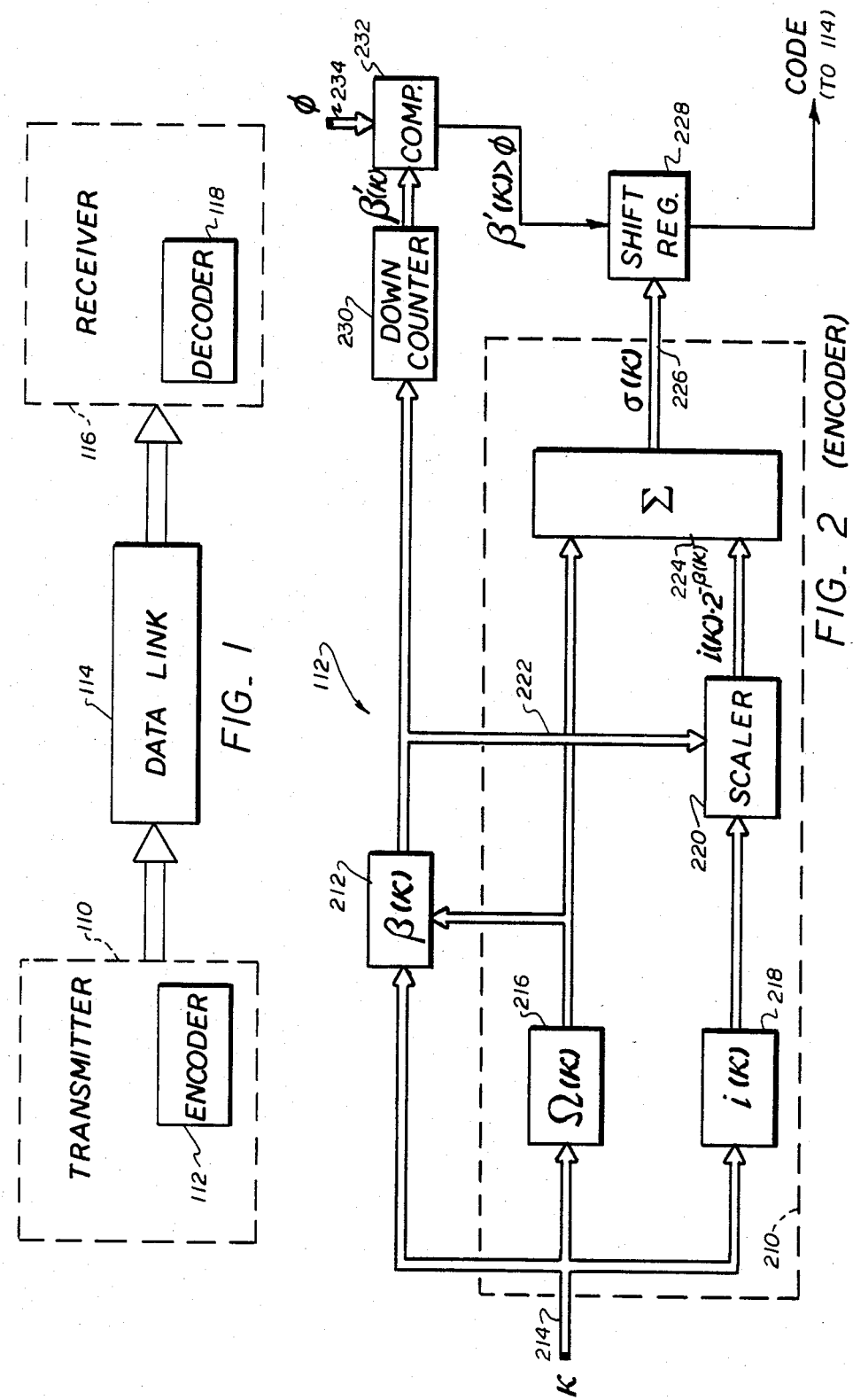

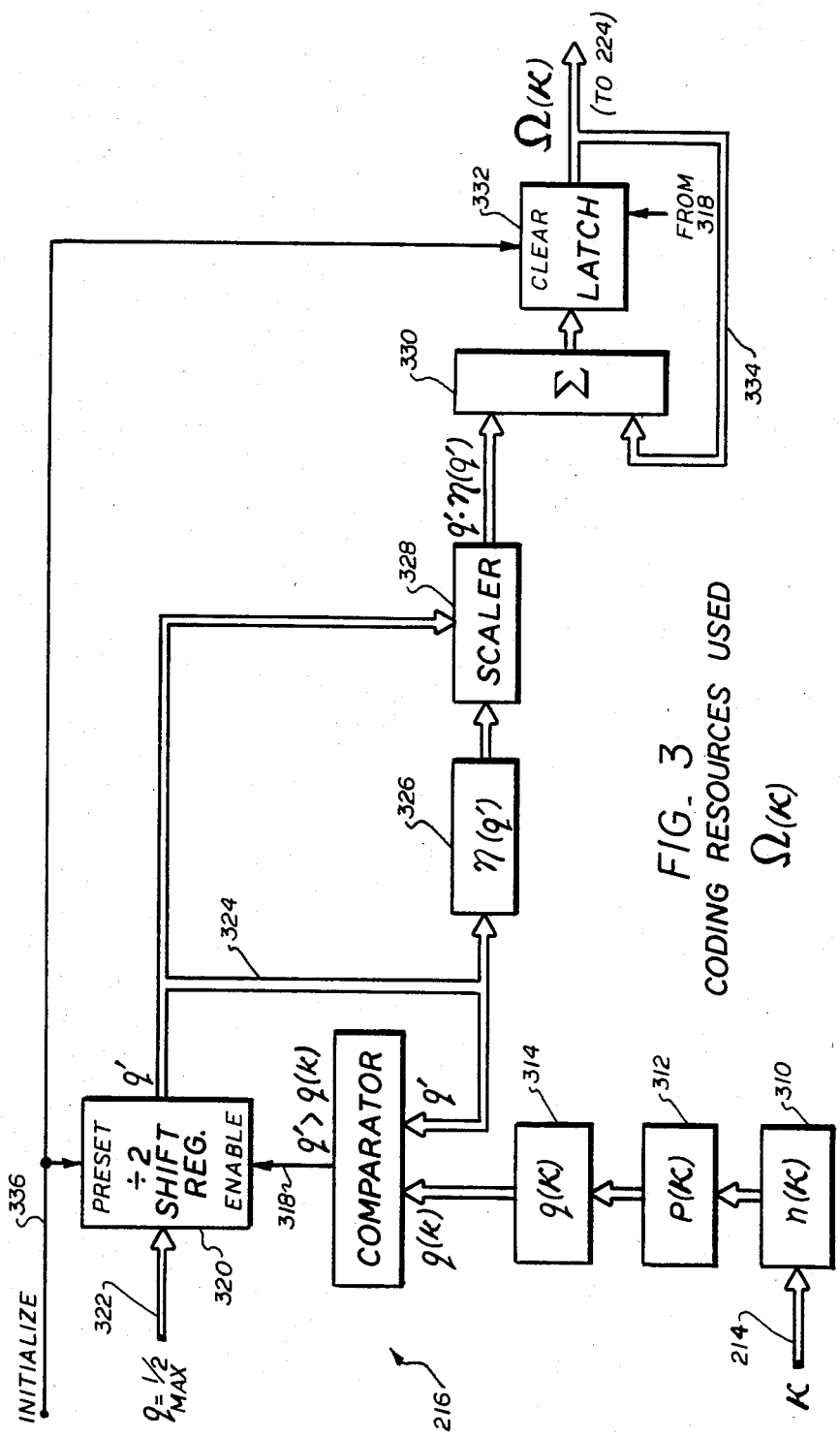

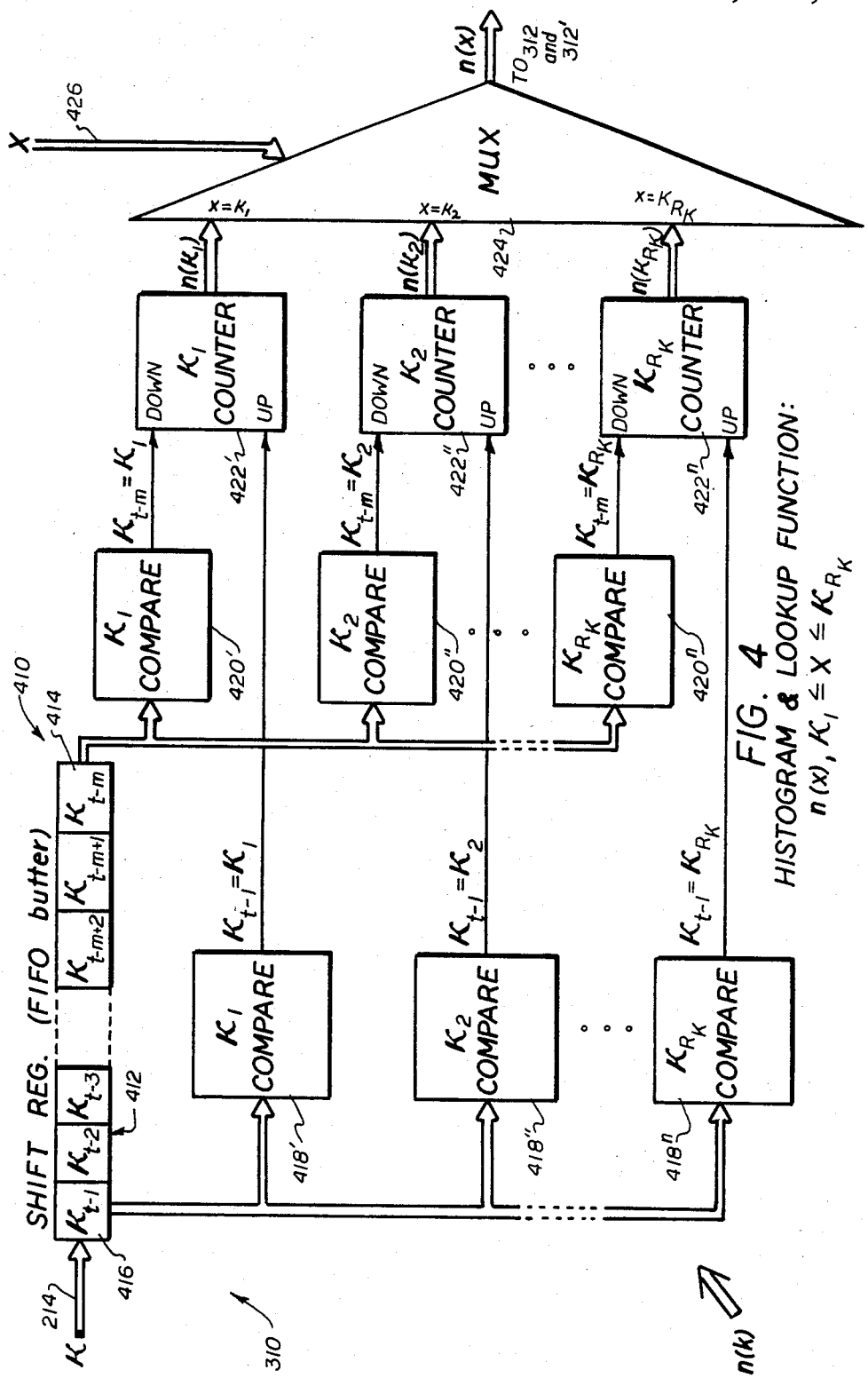

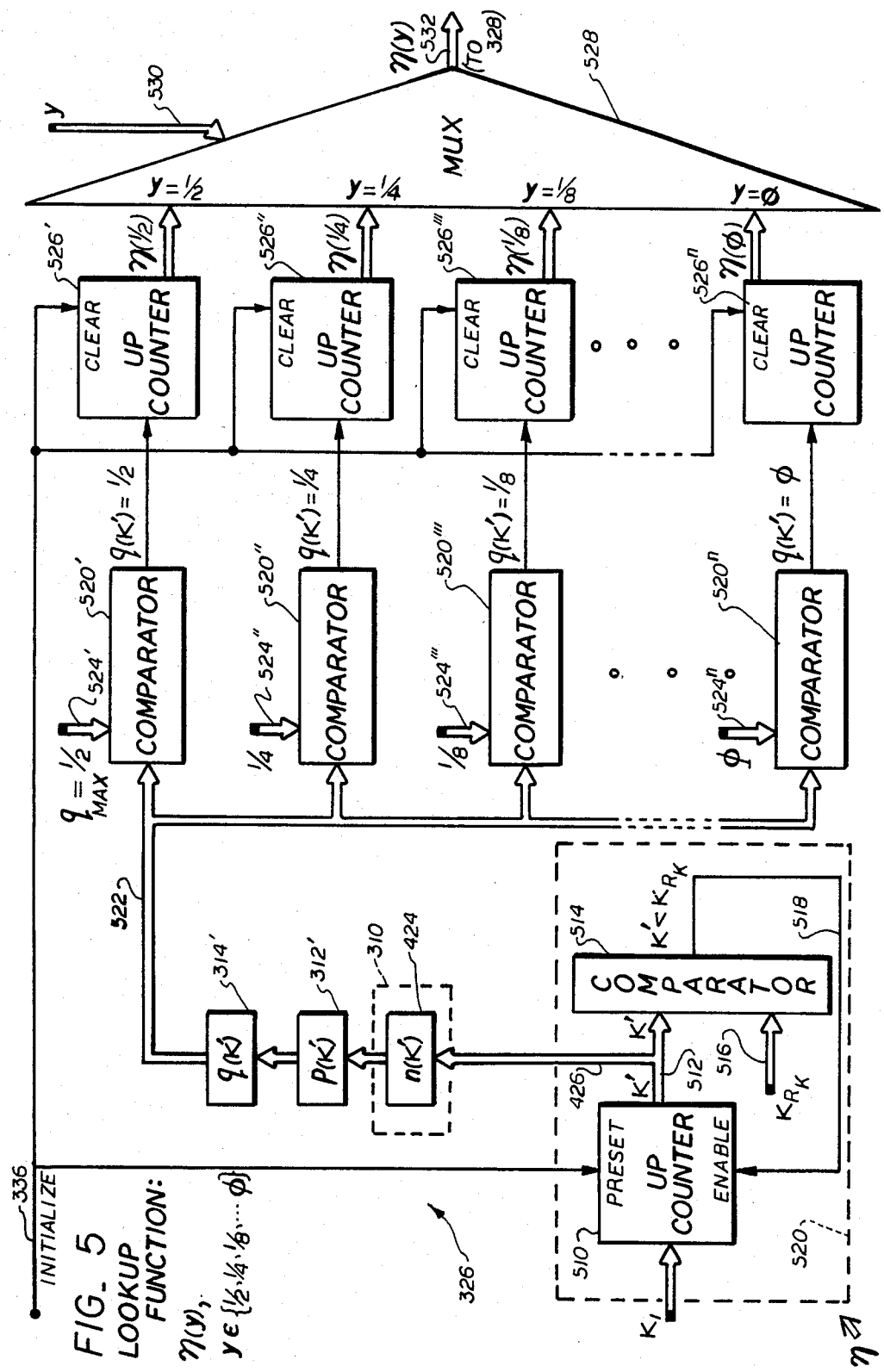

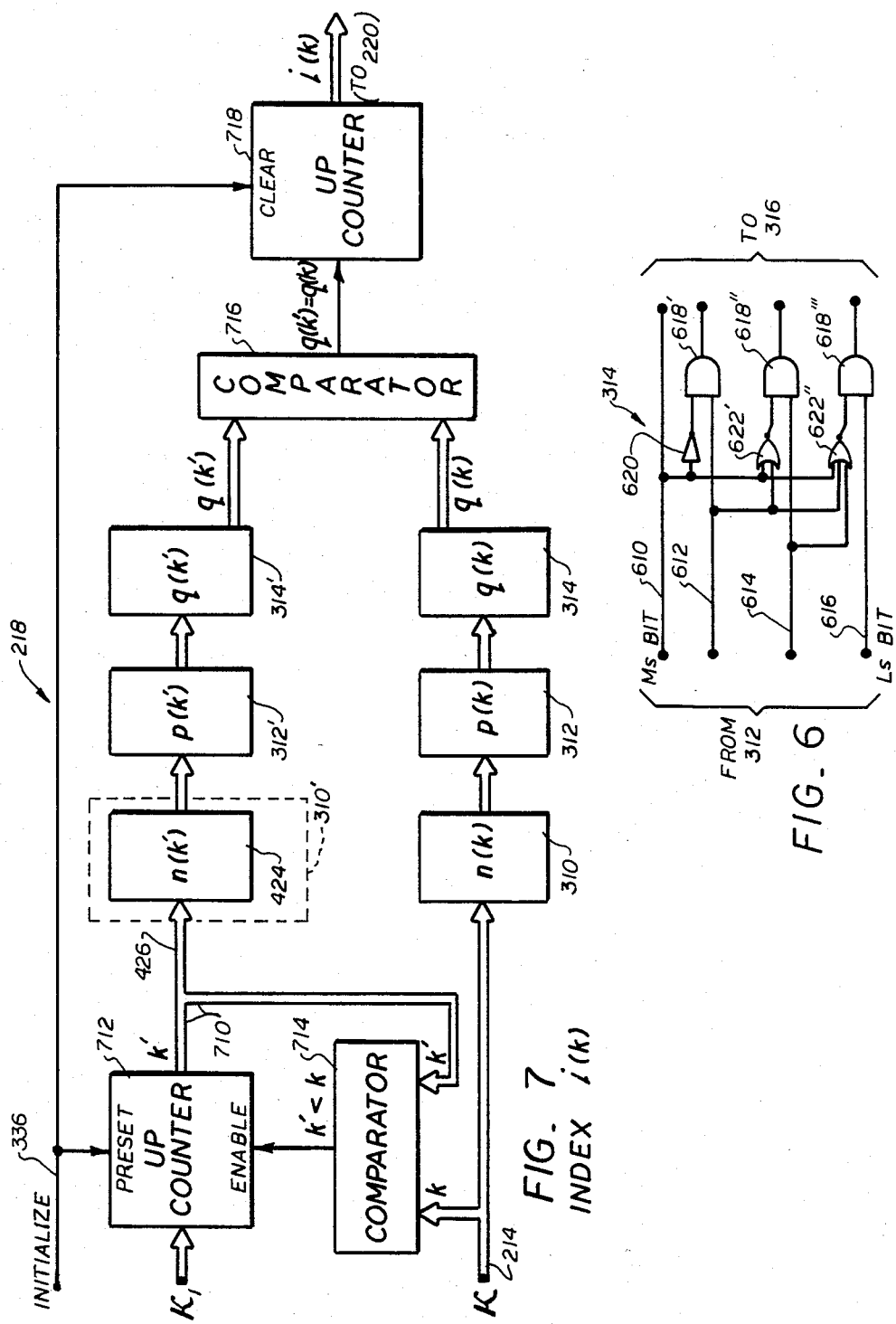

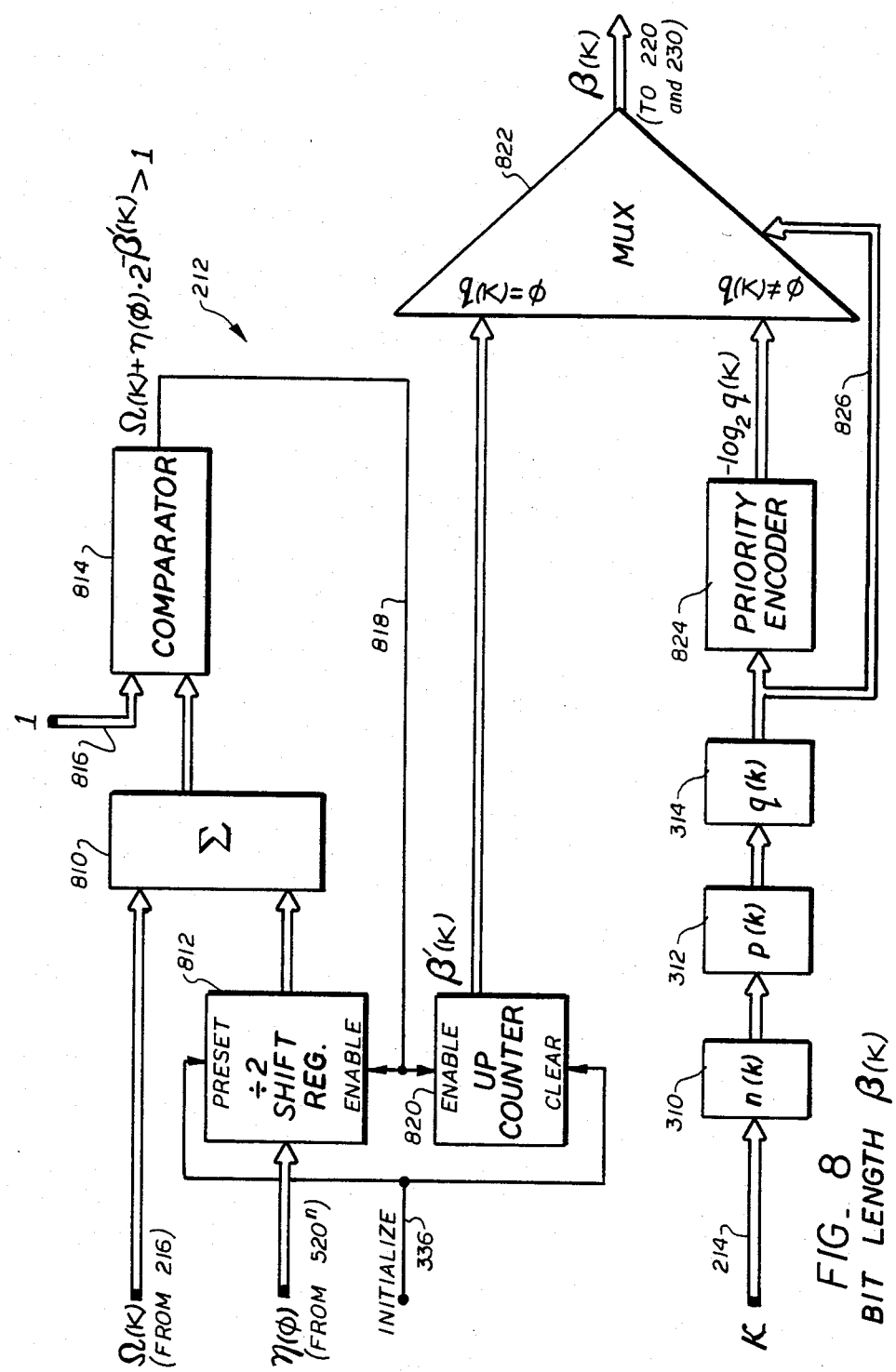
FIG. 8 BIT LENGTH $\beta(K)$

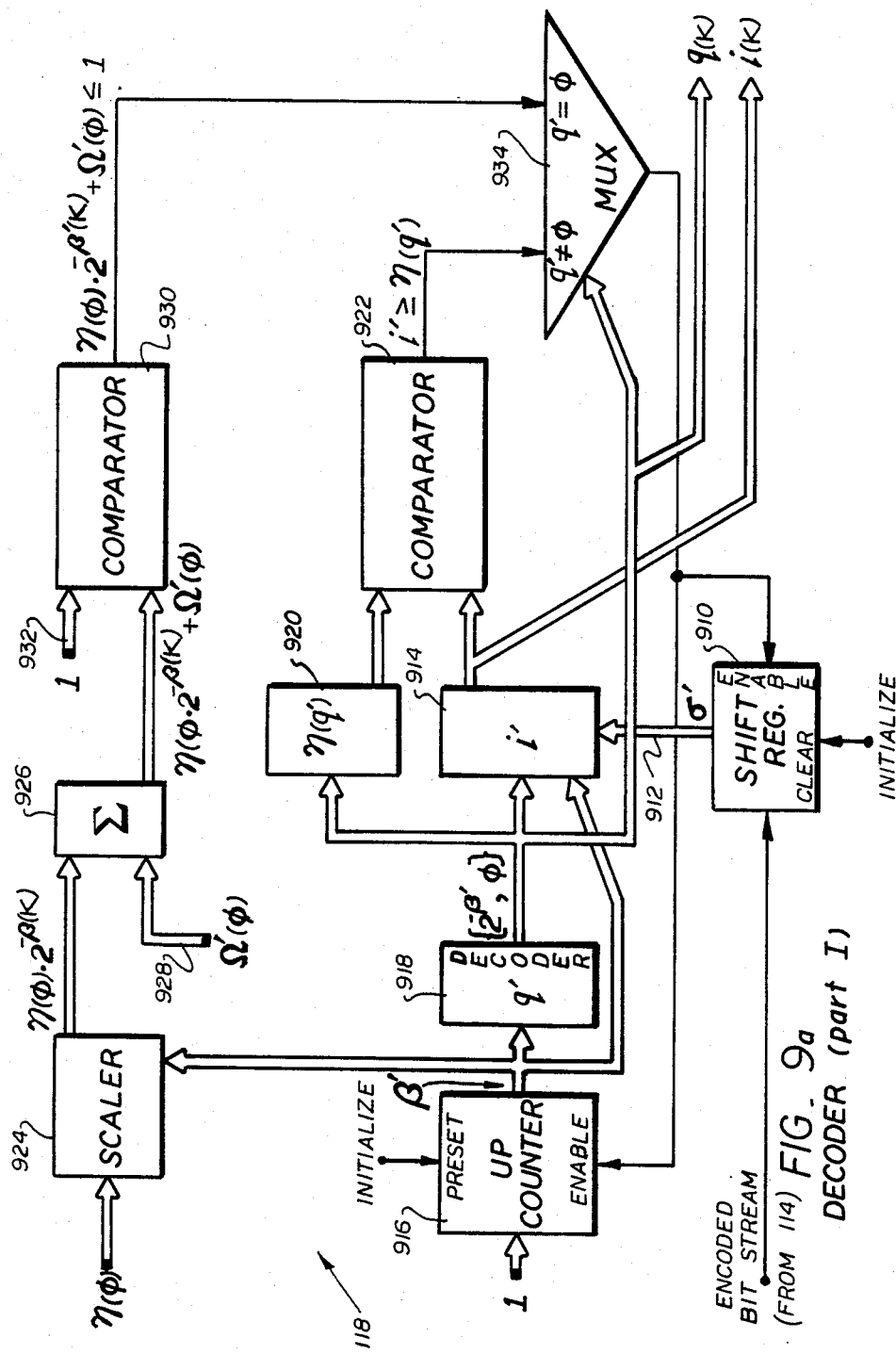
FIG. 9a DECODER (part I)

DECODER (part II)

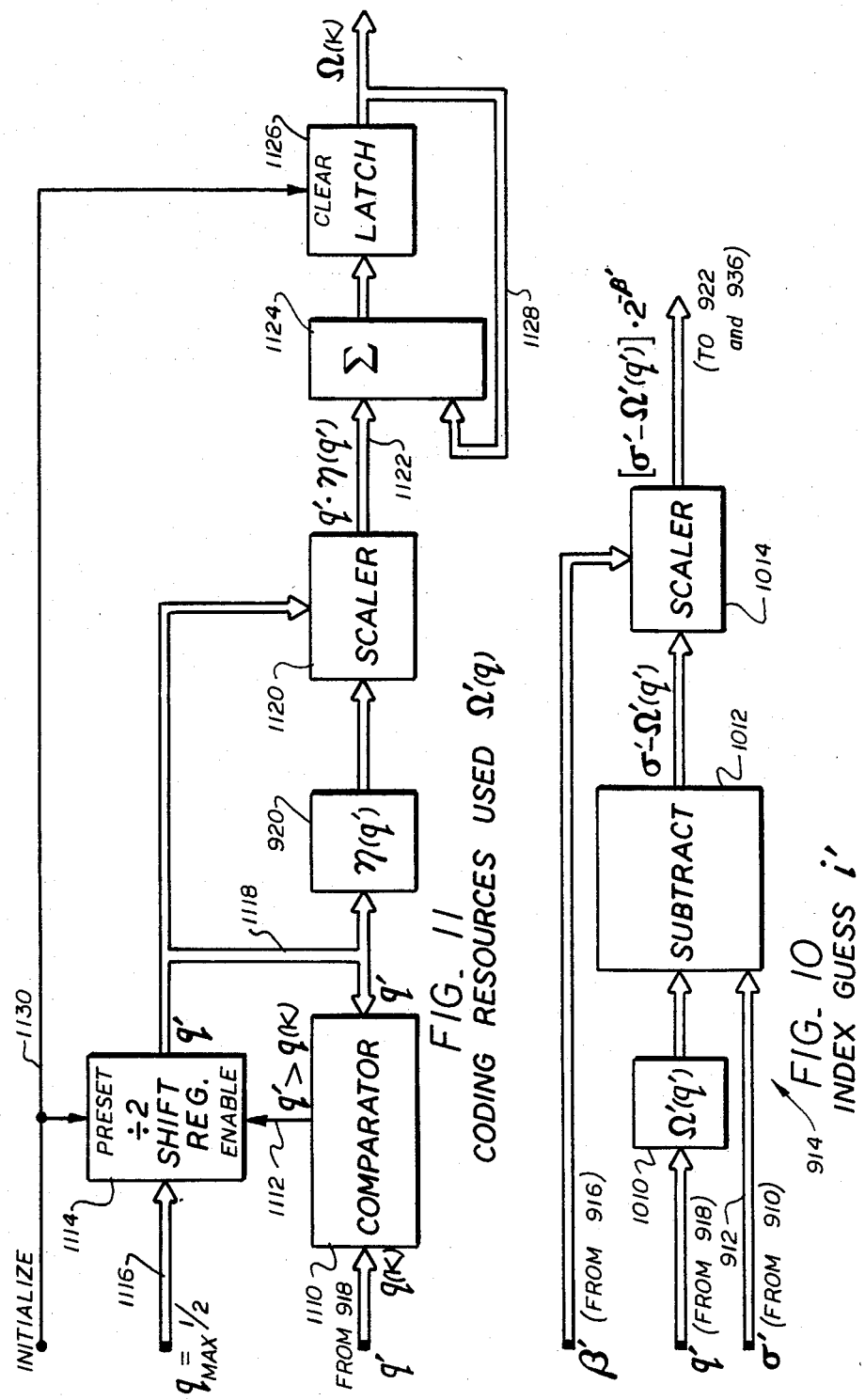

DATA COMPRESSION SYSTEM

BACKGROUND OF THE INVENTION

1. Field of the Invention

The present invention relates generally to data communication techniques and more particularly to new data compression techniques for use in improving the efficiency of data transmission.

2. Discussion of the Prior Art

Numerous techniques and systems have been developed heretofore for improving the efficiency of data storage or transmission of data between remote points. Notable among such systems are those which represent "characters" (letters, numerals, symbols) by codes, such as that developed by the American Standards Code For Information Interchange (ASCII), which generally are of equal length to all characters. In a character based data communications environment, however, not all possible characters appear with equal frequency. It is therefore inefficient to assign codes of equal length to all characters (like ASCII codes) in such an environment. A communications processor cannot in general known ahead of time what the frequency distribution of characters to be transmitted will be. It cannot make a preliminary pass through a data stream in order to determine the frequency distribution by which to assign codes. Moreover, since it must be ready to transmit the code or a particular character with minimal delay, this rules out the possibility of allowing the processor to accumulate data and encode it before beginning transmission. Therefore, in order to be highly efficient, a compression technique for use in a data communications environment must be predictive and adaptive. It should be able to predict the best code assignments for all possible characters based upon the distribution of characters which have already been transmitted. It should be able to detect changes in the frequency distribution of characters in a data stream and adapt its coding scheme accordingly. Furthermore, these functions must be accomplished with minimal down loading of coding information to the receiving processor which must decode the encoded transmission. The technique should be simple enough that it can be implemented on a eight bit microprocessor and it must work with sufficient speed that it can operate in a real time data communications environment.

It has been proposed, therefore, to compress character based and like data by one of two basic techniques. The first is known as "run length coding" as exemplified by the U.S. Pat. Nos. 4,124,870, issued Nov. 7, 1978, to B. R. Shatz, et al and 4,150,400, issued Apr. 17, 1979, to K. Y. Wong, while the latter is known in the art as the delta encoding technique as exemplified by U.S. Pat. No. 3,524,926, issued Aug. 18, 19790 to A. T. Starr, et al. Another example of data bit compression in conjunction with the facsimile transmission of alphanumeric characters can be found in U.S. Pat. No. 4,151,562, issued Apr. 24, 1979, to J. L. Tregay, while U.S. Pat. No. 4,131,915, issued Dec. 26, 1978, to Y, Nakagome, et al, discloses a facsimile signal transmission system which uses dummy codes to increase the number of bits of variable length codes to make the codes longer than a reference bit number predetermined in consideration of the subscanning time at the receiving side of the system.

It is also known in digital message transmission systems in which an analog speech or video signal is converted to a digital pulse train by a technique known as differential pulse code modulation (DPCM). This technique periodically samples the incoming signal and quantize the difference between each pulse sample and a prediction of it based on past samples' values prior to coding the pulse train for transmission. Examples of this technique can be found in U.S. Pat. Nos. 3,772,682, issued Nov. 13, 1973, to J. L. Flanagan, 3,931,596, issued Jan. 6, 1976, to A. Gersho, and 4,206,447, issued June 3, 1980, to Y. W. Ching, et al.

SUMMARY OF THE PRESENT INVENTION

It is a principal objective of the present invention to provide a new data compression scheme which is both predictive and adaptive and which substantially reduces the volume of data which must be transmitted between synchronized remote transmitted and receiver or source and storage media.

Briefly, in accordance with the present invention, a technique is provided for encoding data which can be used in conjunction with a transmitter which creates codes as a function of a character based input data stream, such that the encoding of the characters is of a bit length which is an inverse function of the frequency of appearance of the characters in a sample of characters preceding a specific character being encoded. A data link can be employed in a conventional manner for receiving the characters thus encoded and carrying the codes to a receiver connected to the data link wherein the codes will be decoded back to a character based stream. In order to generate codes of each character of a bit length which is an inverse function of the frequency of appearance of the character in a sample of preceding characters, a histogram is compiled based on the characters in the sample and is used as a basis for determining the probability of occurrence of a particular character and subsequently generating a variable length code based on such probability.

Among the advantages of the present invention is that it provides a compression technique which can operate on a real time basis.

Another advantage of the present invention is that it can be implemented using presently available microprocessing equipment.

These and other objects and advantages of the present invention will no doubt become apparent to those of ordinary skill in the art after having read the following detailed description of the preferred embodiments which are illustrated in the several figures of the drawing.

THE DRAWING

FIG. 1 is a block diagram showing a data transmission system in which encoders and decoders according to the present invention may be employed;

FIG. 2 is a block diagram showing an encoder according to the present invention;

FIG. 3 is a block diagram showing a portion of the encoder of FIG. 2;

FIG. 4 is a block diagram showing a portion of FIG. 3 which compiles a histogram of a sample of proceeding characters in accordance with the present invention;

FIG. 5 is a block diagram showing another portion of the part of the encoder shown in FIG. 3;

FIG. 6 is a schematic diagram showing a gating circuit which can be used in the part of the encoder shown in FIG. 3;

FIG. 7 is a block diagram showing another portion of the encoder as illustrated in FIG. 2;

FIG. 8 is a block diagram showing still another portion of the encoder as illustrated in FIG. 2;

FIGS. 9a and 9b are block diagrams showing a decoder according to the present invention;

FIG. 10 is a block diagram showing a part of the decoder of FIGS. 9a and 9b; and FIG. 11 is a block diagram showing another portion of the decoder of FIGS. 9a and 9b.

DETAILED DESCRIPTION OF THE PREFERRED EMBODIMENT

Theoretical Considerations

Figure 9B:
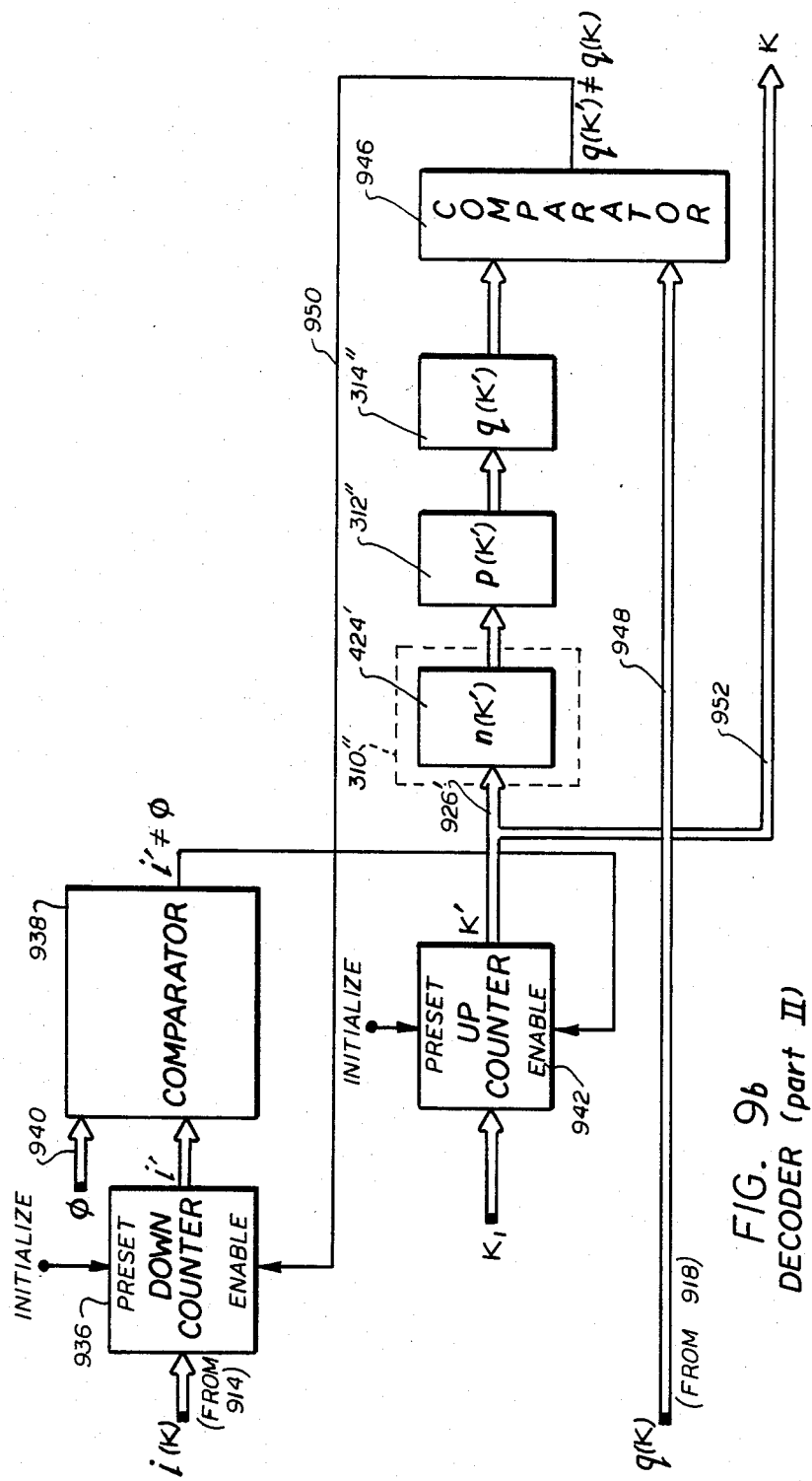

In accordance with the present invention, a method in provided wherein codes are assigned to each character to be transmitted such that the more frequently a character appears in the data the shorter its code will be. As a result the data is effectively compressed and consequently can be transmitted more quickly than would otherwise be possible. Moreover, the compression reduces the channel bandwidth required for transmission; a characteristic which is important in the case where a channel's bandwidth is shared by several data streams as in, for example, a statistical multiplexer system. The system works by being able to detect changes in the frequency distribution of characters in the data stream to be transmitted and adapting its coding scheme accordingly. In accordance with the present invention, a "sample window" is established by dynamically storing the last M characters appearing in the input data stream. Thereafter, as each character is received, a code representative thereof is generated on the basis of the characters already appearing in the sample window. This approach is based upon the assumption that the frequency distribution of characters in the sample window at a given time is probably a good prediction of the distribution of characters which will follow in the data stream. Accordingly, the larger the sample window the more accurate the prediction is likely to be and consequently the better the coding efficiency. After the code for the most recent character has been generated, the character is added to the end of the sample window and the first character in the window, i.e., the character which appeared in the data stream M characters ago is removed. The sample window is thus updated on a character-by-character basis. This allows the coding scheme to adapt quickly to changes in the character frequency distribution since characters representing the old distribution are continuously replaced by new characters. This process also avoids the problem of having to transmit coding information to the decoder at the channel's receiving end. This is possible because the decoder can always decode the next character on the basis of its current sample window and then update the window so that it looks like the encoder's window by simply including the decoded character. In accordance with the present invention, a sample window of length M is selected. If then k is used to represent an element in the set of all possible data characters to be transmitted, a histogram table n(k) is defined which contains for every possible character, the number of times the character appears in the sample window. Thus, $$0 \leq n(k) \leq M \qquad (1)$$

$$\sum_k n(k) = M \qquad (2)$$

The probability p(k) of a character appearing in the data stream is defined as the ratio of the number of occurrences of the character to the total number M of characters in the sample window. Thus, $$p(k) = \frac{n(k)}{M} \qquad (3)$$

$$\sum_k p(k) = 1 \qquad (4)$$

For a character k appearing in the sample window (for which $n(k) \neq 0$) if p(k) is greater than or equal to $\frac{1}{2}$ a one bit binary code can be assigned since there can be at most two such characters. If p(k) is greater than or equal to $\frac{1}{4}$ then a two bit binary code can be assigned since there can be at most four such characters. If p(k) is greater than or equal to $\frac{1}{8}$ then a three bit binary code can be assigned since there can be at most eight such characters, and so on. In general, therefore, a character k is assigned a code of bit length $\beta(k)$ where $\beta(k)$ is the smallest possible integer such that:

$$p(k) > \frac{1}{2^{\beta(k)}} \qquad (5)$$

From equation 3, the above gives the condition:

$$\sum_k 2^{-\beta(k)} \leq 1 \qquad (6)$$

This is a condition which must be satisfied by any instantaneous binary prefix code; that is, a code which may be decoded one bit at a time.

Because of the inperfect ability of the sample window to predict subsequent characters in the incoming data stream, a code may need to be generated for a character which does not appear in the sample window. In this case, n(k)=0. Thus, the probability of such a character appearing, as defined in equation 3, is: p(k)=0. So, equation 5 may be satisfied only by a code of infinite length, since $$\frac{1}{2^{\beta(k)}} = 0 \text{ gives } \beta(k) = \infty \qquad (7)$$

This problem may be avoided by noting that it arises from the possibility that for all characters which do appear in the sample buffer, the condition set forth in equation 6 may be satisfied in the equality:

$$\sum_k 2^{-\beta(k)} = 1 \qquad (8)$$

This will leave no "coding resources" with which to generate codes for characters not appearing in the sample window. Therefore, now redefine the probability set forth in equation 3 as:

$$p(k) = \frac{n(k)}{M+1} \qquad (9)$$

For fairly large values of M, this represents a small change in the sample window's predictive capability. But, it guarantees that:

$$\sum_k p(k) < 1 \quad (10)$$

Thus, there can be at most one character with $p(k) > \frac{1}{2}$, at most 3 characters with $p(k) > \frac{1}{4}$, at most 7 characters with $p(k) > \frac{1}{8}$, and so on. So, if for characters appearing in the sample window we continue to assign codes of length $\beta(k)$ according to equation 5, then equation 10 gives:

$$\sum_k 2^{-\beta(k)} < 1 \quad (11)$$

This guarantees that some coding resources are left over with which to generate codes for characters not appearing in the sample.

Next, a "power of two frequency" $q(k)$ can be defined for a given character k as follows:

If $p(k) \neq 0$, define $q(k)$ as the largest fraction $< p(k)$ which is an integer power of two. Thus:

$$\frac{1}{2} p(k) < q(k) \leq p(k) \quad (12)$$

If $p(k) = 0$, define $q(k)$ as $q(k) = 0$.

Now define a table that is a function of q which contains, for each possible value of $q(k)$, a count of the number of distinct characters with that $q(k)$. Note that:

$$\sum_q \eta(q) = R_k \quad (13)$$

where $R_k$ is the radix of the character set.

Next, define $\Omega(k)$ as the fractional coding resources taken by all characters with a power of two frequency greater than $q(k)$ for a given character. Thus, $$\Omega(k) = \sum_{q' > q(k)} q' \cdot \eta(q') \quad (14)$$

Now, define a character index $i(k)$ as follows:

Let the set of $\eta(q)$ characters with power of two frequencies $= q(k)$ be an ordered set, alphabetically, for example. Define $i(k)$ to specify the position of the character k in this ordered set such that the index $i(k)$ is an integer value of modulo $\eta(q)$. The range of $i(k)$ is defined to be:

$$0 \leq i(k) \leq \eta(q) - 1 \quad (15)$$

The bit length $\beta(k)$ for a code is defined as follows:
If $q(k) \neq 0$, define (k) as:

$$\beta(k) = -\log_2 q(k) \quad (16)$$

If $q(k) = 0$, define $\beta(k)$ to be the smallest integer such that:

$$\eta(0) \cdot 2^{-\beta(k)} + \Omega(k) \leq 1 \quad (17)$$

Note that this is equivalent to the condition set forth in equation 6.

Lastly, define the code for the character k to be the first $\beta(k)$ bits to the right of the decimal point in the fractional sum:

$$\sigma(k) = i(k) \cdot 2^{-\beta(k)} + \Omega(k) \quad (18)$$

Since from equation 15 we have $i(k) < \eta(g)$, the conditions set forth in equation 6 insures that $\sigma(k) < 1$. This means that all bits to the left of the decimal point are 0 are thus unnecessary. From equation 14, all bits less significant than 2 to the minus $\beta(k)$ power in $\sigma(k)$ are always 0, and therefore they are also unnecessary.

The decoding procedure is basically the reverse of the encoding. Recall that the code generator updates the sample window only after a character has been encoded. Therefore, when the decoder begins to receive a code its sample window is identical to the one used by the encoder to generate the code. Accordingly, if we know the $\beta(k)$ of a code $\sigma(k)$ we may regenerate the encoded character as follows:

First, compute the power of 2 frequency $q(k)$ by reversing the process used in equation 16 and 17. This will specify which power of 2 frequency set the encoded character is in. Next, use equation 14 to compute the corresponding value of $\Omega(k)$. Then the index of the character may be obtained by using equation 18 as follows:

$$i(k) = [\sigma(k) - \Omega(k)]2^{\beta(k)} \quad (19)$$

In general, however, the decoder cannot know ahead of time the length of an incoming code. So, it is necessary to make a guess of a code length of $\beta'(k')$ bits. From this, the hypothetical power of 2 frequency $q'(k')$ may be computed. In turn, $\Omega'(k')$ may be computed from $q'(k')$. So, the hypothetica index $i'(k')$ may be computed as in equation 19 as follows:

$$i'(k') = [\sigma(k) - \Omega'(k')]2^{\beta'(k')} \quad (20)$$

Substituting equation 18, this gives a result of:

$$i'(k') = i(k)2^{[\beta'(k') - \beta(k)]} + [\Omega(k) - \Omega'(k')]s^{\beta'(k')} \quad (21)$$

If the above guess is correct, then $\beta'(k)' = \beta(k)$, and $q'(k') = q(k)$, giving $\Omega'(k') = \Omega(k)$. Equation 21 then reduces to $i'(k') = i(k)$, and the encoded character may be regenerated as an equation 19.

Suppose however, that the guess is incorrect, such that $\beta'(k')$ is less than $\beta(k)$. Then, $q'(k')$ is greater than $q(k)$, with the minimum value of $q(k)$ being zero. Therefore, $q'(k')$ is not equal to zero, and from equation 16 is obtained:

$$q'(k') = 2^{-\beta'(k')} \quad (22)$$

From equation 14:

$$\Omega(k) - \Omega'(k') \geq q'(k') \cdot \eta'(q') \quad (23)$$

and so, in this case:

$$\Omega(k) - \Omega'(k') \geq \eta'(q')2^{-\beta'(k')} \quad (24)$$

Equation 21 thus reduces to:

$$i'(k') \geq i(k)2^{[\beta'(k') - \beta(k)]} + \eta'(q') \quad (25)$$

and, since the smallest value of $i(k)$ is, from equation 15, $i(k) = 0$, this may be written:

$$i'(k') \geq \eta'(q') \qquad (26)$$

but, from equation 15, $i'(k')$ must satisfy the condition:

$i'(k') \eta'(q')$, which contradicts the result in equation 26 above. Thus, no character may be regenerated by an incorrect guess, so long as $\beta'(k') < \beta(k)$. In this manner, the decoder can detect when it has made an incorrect guess and then make another guess with a longer code length, and so on, until the condition $i'(k') < \eta'(q')$ is satisfied, indicating the end of the code.

The general procedure for decoding an incoming code is, thus to start with $\beta'(k') = 1$, this being the shortest possible code, and then computing $i'(k')$ from the $\beta'(k')$. If $i'(k')$ satisfies the condition $i'(k') < \eta'(g')$, then the end of the code has been reached and the encoded character may be regenerated. Otherwise, let $\beta'(k') = \beta'(k') + 1$, and repeat the computation of $i'(k')$ from $\beta'(k')$ either until the correct $\beta'(k')$ is found, or until the power of 2 frequency corresponding to $\beta'(k')$ goes to $q'(k') = 0$. If $q'(k')$ goes to 0, the correct code length may immediately be computed using the condition:

$$\eta'(0) \cdot 2^{-\beta'(k')} + \Omega'(k') \leq 1, \qquad (27)$$

for characters not in the sample window, as set forth in equations 16 and 17. If it happens that $i'(k') < \eta'(g')$ is still not satisfied, then this is a fatal error indicating that a transmission error has caused the decoder to lose syncronization with the encoder; that is, their sample windows are no longer identical.

Implementation Considerations

We turn now to considerations in the implementation of the present invention. Specifically, a discussion shall be set forth regarding the suitability of the above theoretical considerations for use with a conventional 8 bit microprocessor.

Suppose we choose a sample window length of $M = 255$ characters. Then the sample window may conveniently be represented in a 256 byte block, with one byte serving as a pointer to the beginning of the sample window. In addition, from equation 9, the probability becomes:

$$p(k) = \frac{n(k)}{M+1} = \frac{n(k)}{256} \qquad (28)$$

The probability may, therefore, be represented as an 8 bit byte simply containing $n(k)$, with the decimal point moved to the left of the most significant bit of the byte. This means the probability may be taken directly from the histogram $n(k)$ without the need for any cumbersome fixed point division operations. The power of 2 frequency $q(k)$ corresponding to $p(k)$ is then simply the value $n(k)$ with all bits following the most significant non-zero bit set to zero.

For $q(k)$ not equal to zero, the bit length $$\beta(k) = -\log_2 q(k) \qquad (29)$$

may be obtained from the count of $+1$ of the number of zero bits to the left of the most significant non-zero bit of $n(k)$. So, the maximum bit length of a code, when $q(k) \neq 0$, is $\beta(k) = 8$. Note too, that with an ASCII character set, allowing for all possible parity types, the radix is $R_k = 256$. So, from equation 13 we are guaranteed that all $n(g)$ fit into 8 bits. Further, from the discussion following equation 10 and from equation 14 we see that the value $\Omega(k)$ will always fit into 8 bits as well. Therefore, it is concluded that this data compression technique is fairly well suited to implementation using an 8 bit microprocessor with only simply logic and data manipulation operations.

The principle exception to the above arises in the case $q(k) = 0$. In this instance, $\beta(k)$ must be determined by $$\eta(0) \cdot 2^{-\beta(k)} + \Omega(k) \leq 1 \qquad (30)$$

Which may give bit lengths $\beta(k)$ greater than 8, and thus involve fractions with more than 8 significant bits. In this case, some 16-bit operations would be desirable. Note that since $\eta(g)$ and $\Omega(k)$ both fit into 8 bits, the expression above indicates that no code for a character not in the sample window ever needs to be more than 16 bits in length.

Suitability To Real-Time Environment

The discussion will now direct itself to the suitability of the present invention to real-time environments.

The limit to the speed at which the instant data compression technique can be used is determined primarily by three processes. First, $\Omega(k)$ is calculated by summing several terms. For example, if a sample window length of $M = 255$ is used as set forth above, then the worst case number of terms is 8. Each term involves a table look up and suitable scaling operations to form a product of the form $q \cdot \eta(q)$. Second, $\beta(k)$ is calculated for the condition $q(k) = 0$. This involves repeated scaling and test operations. As discussed above in conjunction with equation 30, these operations may require more than 8 bits of precision, and may be time consuming if not efficiently implemented on a 8 bit microprocessor.

Lastly, $i(k)$ is calculated by counting the number of characters preceding k in the ordered set of characters that have power of 2 frequencies equal to $q(k)$. If all $R_k$ possible characters have equal probability, this calculation would require $R_k$ operations. Within an ASCII character set, allowing for all possible parity types as discussed above, could in the worst case involve 256 operations to determine $i(k)$. Each operation would involve the computation and comparison of a character's power of 2 frequency. Therefore, this calculation is potentially the most time consuming. As discussed above, however, most of these calculations can be performed with simple logic and data manipulation operations capable of being executed quickly by a conventional microprocessor. Accordingly, although it may require a significant portion of a microprocessor's computing power, the present technique is relatively well suited to the real-time environment. All that need be determined are speed limitations of a particular implementation, the speed versus cost tradeoffs involved, and a determination of actual coding efficiency improvements.

Discussion of FIGS. 1-8

The construction and operation of a preferred embodiment of a system capable of carrying out the instant technique in a real-time environment will now be discussed.

Referring more particularly to FIG. 1 of the drawings, there is shown a transmitter 110 incorporating an encoder 112 according to the present invention. The output from tranmitter 110 goes to a data link 114 which in turn carries the data to a receiver 116 incorporating a decoder 118 according to the present invention. While transmitter 110, data link 114 and receiver 116 are generally of conventional construction which will not be described in great detail herein, the details of construction of encoder 112 and decoder 118 will be described below.

Referring now to FIG. 2, encoder 112 is illustrated as comprising a code generator 210 and a bit length determining unit 212 arranged in parallel so as to receive a common character base input data stream 214 representing a plurality of characters k. Code generator 210 is disposed for performing calculations on stream 214 so as to develop a code for each character the length of which is an inverse function of the frequency of the character in a sample of preceding characters. Bit length determining unit 212 is arranged for determining the number of bits of a code for each character as developed by code generator 210 that will form an actual code for a specific character k.

Included in code generator 210 is a fractional coding resources unit 216 and a character index unit 218 connected in parallel with respect to stream 214 for receiving a data input therefrom. The output of character index unit 218 is connected to a scaler 220 to which also is fed the output 222 from bit length determining unit 212. The output from scaler 220 together with the output from fractional coding resources unit 216, which also goes into bit length determining unit 212, are fed in parallel to a summing unit 224.

The output 226 from summing unit 224 which output represents the code per character $[\sigma(k)]$, is fed in parallel into a shift register 228, the enable input to which is the output from a down counter 230 and a comparator 232. Down counter 230 receives the output from bit length determining unit 212 and outputs it as $\beta'(k)$ and then successively decrements the output value while comparator 232 compares this function $\beta'(k)$ with an input 234 signal representing zero to determine if $\beta'(k)$ is greater than zero and permitting only signals in the latter category to enable shift register 228. The serial output of shift register 228 is a code for a particular character k.

FIG. 3 illustrates schematically the details of fractional coding resources unit 216. Receiving the incoming data stream 214 is a histogram forming unit 310 to be described below and the output of which is fed into a divider 312 which determines the probability of occurrence of a given character k. The output from divider 312 is fed into a power of 2 frequency determining unit 314. As will be discussed below, the effect of divider 312 is to form a binary fractional frequency of the histogram determined in unit 310, while unit 314 merely changes to zero all bits to the right of the most significant "1" bit appearing in such binary fraction.

The output of unit 314 is fed into a comparator 316, the output 318 of which is enabled only for those power-of-2 frequencies q' greater than q(k) fed into comparator 316 from unit 314. This is accomplished by feeding the output 318 to enable a divide-by-2 shift register 320 having an input 322 representing $q_{max}=\frac{1}{2}$. The output from register 320 represents q' and is fed via line 324 to the other input of comparator 316, such that the latter can enable output 318 only for q' greater than q(k) as received from unit 314. The line 324 also forms an input to a table forming unit 326, the output of which is fed to a scaler 328. The latter also receives the output of register 320, that is q', so as to form an output $q'\cdot\eta(q')$ which is fed to one of the inputs of a summing unit 330. The output of unit 330 goes to a latch 332 so that the outputs of scaler 328 are successively summed by unit 330 until the condition q'>q(k) is no longer satisfied and comparator 316 no longer enables output 318. Latch 332 permits the successive summing of the outputs of 328, with latch 332 being enabled by 318. Following disablement of 318, latch 332 outputs a signal $\Omega(k)$, which is also fed via line 334 to the other input of summing unit 330.

Line 336, which is designated "initialize," is typical for initializing circuits of encoder 112 in a known manner and in this case is in response to a request from data stream 214 indicating the presence of a character.

Referring now to FIG. 4, histogram forming unit 310 has a sample window unit 410 formed by a conventional serial and parallel shift register 412. The data stream 214 is fed serially into register 412, with the first-in character being designated 414 and the last-in character being designated 416. Register 412 is shifted after a code for each character in stream 214 is determined. The latter are fed to parallel comparators 418', 481", . . . 418$^n$. There will be one such comparator 418, and sequence, for the number of different characters which are possible in data stream 214. Thus, if the last-in character 416 is a $k_2$, for example, it will be gated through comparator 418". In a like manner, the serial output from the register 412, representing the content of the first-in character 414 when register 412 was last shifted serially, are fed to a plurality of parallel comparators 420', 420", . . . 420$^n$. The output from each of these comparators 418 and 420, and sequences, are fed to respective up and down sides of an associated one of a plurality of up/down counters 422', 422", . . . 422$^n$. The output from these counters 422, and sequence, is fed into a conventional multiplexer or data selector 424 which in effect forms a table of the frequency history of the sample contained in shift registers 412. This data can be gated out of data selector 424 by use of a control 426 which selects a certain character "x" as desired.

FIG. 5 illustrates schematically the details of table forming unit 326. This circuit forms a table for look up purposes which is defined above an $\eta(y)$, where Y is a set of all possible power-of-2 frequencies $[\frac{1}{2}, \frac{1}{4}, \frac{1}{8}, \ldots, \emptyset]$.

Unit 326 comprises an up counter 510 arranged for successively outputting the set of all possible characters beginning with the first character in the set $k_1$. The output 512 of counter 510 is branched, with one fork going to one input of a comparator 514, and the other input of which is the radix character of the set. The output 518 from comparator 514, being $K'<K_{Rk}$, is returned to counter 510 for enabling same. Counter 510 and comparator 514 cooperate to form a character sequence generator 520. The other fork of output 512 goes to data selector 424 wherein data for the particular character in counter 510 is selected from that compiled by unit 310. Divider 312' and 314' are duplicates of divider 312 and unit 314 and perform the same operations on the output of data selector 424.

The output from unit 314' is fed to a parallel set of comparators 520', 520", 520''', . . . , and 520$^n$. One connection to these comparators is made by the line 522 leading from unit 314', while the other inputs, designated 524', 524", 524''', . . . , 524$^n$, represent the members of the set Y as defined above. The output from these comparators 520' and sequence, such ouput representing the members of the set Y, are connected to respective counters 526', 526", 526''', . . . , 526$^n$. The latter are up counters which are only gated by the presence of a signal for the member of the set Y with which the specific counter is associated, and which feed their output signals to a multiplexer or data selector 528. Control 530 of this data selector 528 represents the selecting member of set Y, with the output 532 being $\eta(y)$.

FIG. 6 discloses a circuit for the power of 2 frequency determining unit 314. As illustrated, this circuit includes, for example, four input lines, although the number may vary, ranging from the most significant bit line 610 through lines 612 and 614 to the least significant bit line 616. The output includes the line 610 as well as three lines extending from the outputs of AND gates 618', 618'', and 618'''. The line 612, 614 and 616 form one input to each of these gates, while the other input to gate 618' is a NOT gate 620 connected to line 610. The other input to gate 618'' is a NOR gate 622' having inputs connected to line 610 and 612, and in a similar manner a NOR gate 622'' forms the other input to gate 618''' and has its inputs connected to lines 610, 612 and 614. As will be appreciated, this circuit requires that as soon as one of the four bits ranging from 610 to 616 is a "1", all subsequent, or less significant, bits will be made zero.

FIG. 7 illustrates schematically the character index unit 218. The input to this unit is the character data stream 214 which divides into two branches. One branch cooperates with the output 710 of an up counter 712 to form the inputs to a comparator 714. The output of comparator 714, which represents k' less than k, enables the counter 710, the input to which is the same as that to counter 510 and the output of which is k'. The output of counter 712 and the other branch of the input stream 214 are fed to the control 426 of data selector 424 and to the unit 310, respectively, so as to obtain the respective outputs q(k') and q(k). The latter outputs form the inputs to a comparator 716, whose output in turn is the equality q(k') equals q(k) and forms the input to an up counter 718 the output of which is the character index i(k).

Finally, we come to the bit length determining unit 212 as illustrated in FIG. 8. The signal representing $\Omega(k)$ is fed from unit 216 to one input of a summing unit 810 the other input to which is the output of a divider/shift register 812. The latter has as its input the signal representing $\eta(\emptyset)$ received from 526''. The output of the summing unit 810 forms one input to a comparator 814, to other input 816 of which represents the value 1. Accordingly, the output 818 of comparator 814 enables shift register 812 and an up counter 820, the output of which is $\beta'(k)$. The latter output forms one of the inputs to a multiplexer or data selector 822, the other input to which is the output of unit 314 fed through a priority encoder 824 so as to give a signal as defined by equation 16 set forth above. The output from unit 314 also is connected by line 826 to data selector 822 to form a control therefore, with the output of selector 822 being $\beta(k)$.

Priority encoder 824 can be of a conventional construction, similar to those TTL encoders designated type SN 54147, and the like, which insure that only the highest-order data line is coded.

Operation of the Encoder Shown in FIGS. 1–8

The operation of the encoder 112 will now be discussed.

For simplicity, this discussion will be based on a character set of 16 possible characters A–P, and shall refer to the following table:

| k | n(k) | p(k) | q(k) | $\Omega$(k) |
| --- | --- | --- | --- | --- |
| A | 3 | .0011 | .0010 | .0100 |
| B | 0 | .0000 | .0000 | .1011 |
| C | 0 | .0000 | .0000 | .1011 |
| D | 0 | .0000 | .0000 | .1011 |
| E | 6 | .0110 | .0100 | .0000 |
| F | 1 | .0001 | .0001 | .1000 |
| G | 0 | .0000 | .0000 | .1011 |
| H | 0 | .0000 | .0000 | .1011 |
| I | 0 | .0000 | .0000 | .1011 |
| J | 1 | .0001 | .0001 | .1000 |
| K | 0 | .0000 | .0000 | .1011 |
| L | 0 | .0000 | .0000 | .1011 |
| M | 3 | .0011 | .0010 | .0100 |
| N | 1 | .0001 | .0001 | .1000 |
| O | 0 | .0000 | .0000 | .1011 |
| P | 0 | .0000 | .0000 | .1011 |

| k | $\beta$(k) | i(k) | $\sigma$(k) | code |
| --- | --- | --- | --- | --- |
| A | 3 | 0 | .01000 | 010 |
| B | 5 | 0 | .10110 | 10110 |
| C | 5 | 1 | .10111 | 10111 |
| D | 5 | 2 | .11000 | 11000 |
| E | 2 | 0 | .00000 | 00 |
| F | 4 | 0 | .10000 | 1000 |
| G | 5 | 3 | .11001 | 11001 |
| H | 5 | 4 | .11010 | 11010 |
| I | 5 | 5 | .11011 | 11011 |
| J | 4 | 1 | .10010 | 10010 |
| K | 5 | 6 | .11100 | 11100 |
| L | 5 | 7 | .11101 | 11101 |
| M | 3 | 1 | .01100 | 011 |
| N | 4 | 2 | .10100 | 1010 |
| O | 5 | 8 | .11110 | 11110 |
| P | 5 | 9 | .11111 | 11111 |

The histogram forming unit 310 creates a histogram table n(k) which contains the number of times each possible character appears in the sample window unit 410. Note that the sum of all elements of n(k) gives the sample window length M; in this case M=15.

Since M=15, the probability, p(k), associated with a character is:

$$p(k) = \frac{n(k)}{M+1} = \frac{n(k)}{16}, \tag{31}$$

which is simply the binary representation of n(k) with the decimal point shifted left four places in unit 312. Next, the power of 2 frequency q(k) is obtained from p(k) by simply setting to zero in unit 314 all bits to the right of the most significant non-zero bit. Recall that the table $\eta(q)$ contains the counts of the number of characters with each of the possible power of 2 frequencies q(k):

| TABULATE |
| --- |
| $\eta(.1000) = 0$ |
| $\eta(.0100) = 1$ |
| $\eta(.0010) = 2$ |
| $\eta(.0001) = 3$ |
| $\eta(.0000) = 10$ |

The value of $\Omega(k)$, determined in unit 216, is obtained from the sum:

$$\Omega(k) = \sum_{q' > q(k)} q' \cdot \eta(q') \tag{32}$$

for characters with q(k)=0.0100 this becomes:

$$\Omega(k) = \frac{q'}{.1000} \times \frac{\eta(q')}{0} = 0 \quad (33)$$

for characters with q(k)=0.0010:

$$\begin{array}{c} \frac{q'}{.1000} \times \frac{\eta(q')}{0} \\ = \frac{.0100 \times 1}{\Omega(k) = .0100} \end{array} \quad (34)$$

for characters with q(k)=0.0001:

$$\begin{array}{c} \frac{q'}{.1000} \times \frac{\eta(q')}{0} \\ .0100 \times 1 \\ \underline{.0010 \times 2} \\ \Omega(k) = .1000 \end{array} \quad (35)$$

for characters with q(k)=0.0000:

$$\begin{array}{c} \frac{q'}{.1000} \times \frac{\eta(q')}{0} \\ .0100 \times 1 \\ .0010 \times 2 \\ \underline{.0001 \times 3} \\ \Omega(k) = .1011 \end{array} \quad (36)$$

For characters with q(k)≠0 the code bit length (k) as determined in unit 212 is obtained from:

$$\beta(k) = -\log_2 q(k) = \begin{cases} 1, q(k) = .1000 \\ 2, q(k) = .0100 \\ 3, q(k) = .0010 \\ 4, q(k) = .0001 \end{cases} \quad (37)$$

For q(k)=0, (k) is obtained from the condition $$\eta(0) \cdot 2^{-\beta(k)} + \Omega(k) \leq 1 \quad (38)$$

Note that multiplying η(0) by $2^{-\beta(k)}$ is equivalent to shifting the binary value η(0.0000)=1010 β(k) places to the right. Using Ω(k)=0.1011, we see that for β(k)=5:

$$\begin{array}{c} .1011 = \Omega(k) \\ \underline{+\ .01010} = \eta(.0000) \times 2^{-5} \\ 1.00000 \end{array} \quad (39)$$

which satisfies the condition above exactly; therefore, β(k)=5 for q(k)=0.0000. Note that if β(k)=4, the result is:

$$\begin{array}{c} .1011 = \Omega(k) \\ \underline{.1010} = \eta(.0000) \times 2^{-4} \\ 1.0101 \end{array} \quad (40)$$

which does not satisfy the condition set forth above. So, β(k)=5 is the smallest code bit length for characters not appearing in the sample.

The character index i(k) is obtained in unit 218 by dividing the character set into the subsets of characters with the same q(k), ordering them alphabetically, in this case, and numbering the elements of each subset beginning with 0:

| | char. | i(k) |
|---|---|---|
| q(k) = .1000 | E | 0 |
| q(k) = .0010 | A | 0 |
| | M | 1 |
| q(k) = .0001 | F | 0 |
| | J | 1 |
| | N | 2 |
| q(k) = .0000 | B | 0 | (41)
| | C | 1 |
| | D | 2 |
| | G | 3 |
| | H | 4 |
| | I | 5 |
| | K | 6 |
| | L | 7 |
| | O | 8 |
| | P | 9 |

The value of the code per character σ(k) is obtained form the equation $$\sigma(k) = i(k) \cdot 2^{-\beta(k)} + \Omega(k) \quad (42)$$

This may be computed by shifting the binary value i(k) to the right β(k) places in scaler 220 and then adding Ω(k). For example, for the character k=M, the result is:

$$\begin{array}{l} i(k) = 1 \\ \beta(k) = 3 \\ \text{and } \Omega(k) = .0100 \end{array} \quad (43)$$

Shifting i(k) three places to the right gives 0.001, and adding Ω(k) in unit 224 gives σ(k)=0.01100.

The actual code for a character is finally obtained by taking the β(k) most significant bits of the result σ(k) in register 228; that is, the first β(k) bits to the right of the decimal point. For example, for the character M, taking the first β(k)=3 bits of σ(k)=0.01100 gives the code 011.

Note that no code is a prefix in any other code; therefore, the codes may be decoded "instantaneously", or one bit at a time.

Discussion of FIGS. 9-11

A decoder 118, according to the invention, will be described with references to FIGS. 9a and 9b. In FIG. 9a, an encoded bit stream is received from data link 114 and fed into a shift register 910. The parallel output 912 of register 910, which represents σ', is fed into a character index unit 914 which computes a hypothetical index based on output σ' from register 910, with a signal received from a counter 916, which is a hypothetical bit length, and a decoder 918, which provides a hypothetical power-of-2 frequency. Counter 916 increments one each time same is enabled in a manner to be described below so as to cause the appropriate number of bits to be shifted into register 910 and cause all hypothetical signals to assume their correct values.

The output of decoder 918 is fed to a look-up unit 920, similar to unit 326, which gives a hypothetical η(q'), with the outputs of units 914 and 920 forming inputs to a comparator 922. A scaler 924 receives the output from counter 916 so as to cooperate with a signal representing η(0), from 526'', to give an output to a summing unit 926 which is combined with an input 928 representing $\Omega'(0)$, derived as described below, to give a combined output which forms one of the inputs to a comparator 930. The other input 932 to comparator 930 is the value "1", with the output of this comparator 930 being true when the output of 926 is less than or equal to one. The outputs of comparators 922 and 930 form the inputs to a multiplexer or data selector 934 which is controlled by the output of decoder 918 and the output of which enables register 910 and counter 916.

The outputs of unit 914 and decoder 918, once stable, from the inputs to the portion of decoder 118 shown in FIG. 9b. The output from unit 914, that output representing the character index i(k), is fed into a down counter 936 the output of which forms one input to a comparator 938. The other input 940 to comparator 938 represents zero, such that the output of comparator 938 represents i' not equal to zero and forms the enabling input to an up counter 942. The input 944 to counter 942 is the first character in the character set, $k_1$, and the output of counter 942 represents k'. Although not shown in detail, the decoder 118 includes a histogram forming unit 310" similar to that designated 310 for the encoder and including a data selector 424', as well as a probability determining divider 312" similar to 312 and a power-of-2 frequency unit 314" similar to 314. The output of counter 942 forms input 426' to selector 424'. The other input 948 of comparator 946 receives the output of decoder 918, with the output 950 of the comparator 946 being the equality q(k')=q(k) and forming the enabling signal for down counter 936.

The output of up counter 942 also represents the decoded character k whenever comparator 946 no longer enables down counter 936.

Referring now to FIG. 10, the construction of a character index unit 914 is illustrated wherein a coding resources unit 1010 receives a signal from the decoder 918 and is gated by same to send a signal to one of the inputs of a subtract unit 1012. The other input to unit 1012 is the output, $\sigma'$, from shift register 910 as represented by line 912. The output from subtract unit 1012 is sent to a scaler 1014 together with the output $\beta'$ from up counter 916.

FIG. 11 illustrates schematically the coding resources unit 1010. A comparator 1110 receives an input from 918 and has its output 1112 enabling a divider/shift register 1114. The input 1116 to the latter represents $q_{max}=\frac{1}{2}$, with the output representing q' and being fed via line 1118 to the other input of comparator 1110. The output of shift register 1114 is also fed into table forming unit 920 and to a scaler 1120 which also receives the output of unit 920. The output 1122 of scaler 1120 represents q' $\eta(q')$ and forms one input to a summing unit 1124 the output of which is fed to a latch 1126. The output 1128 of latch 1126 is both the other input to summing unit 1124 and is the output of the unit representative of $\Omega(k)$.

Although the above description has been directed to a single preferred embodiment of the present invention, it is contemplated that numerous alterations and modifications thereof will become apparent to those skilled in the art after having read this disclosure. It is therefore intended that the following claims be interpreted as covering all such alterations as fall within the spirit and scope of the invention.

What is claimed is:

1. A data transmission system, comprising, in combination:

(a) transmitter means for creating codes as a function of a character based input data stream and including encoder means for encoding each character with a code having a bit length which is an inverse function of the frequency of appearance of the character in a sample of a predetermined number of immediately preceding characters in said data stream, said encoder means including code generating means for receiving said input data stream and for developing a code for each character received, and bit length means for receiving the same input data stream as said code generating means and for determining from said predetermined number of characters the number of bits of a code to be developed by the code generating means for a specific character k, said code having a bit length $\beta(k)$, where $\beta(k)$ is the smallest positive integer such that the non-zero probability p(k) of a character appearing in said predetermined number of characters is > or = to 1/(2 to the $\beta(k)$ power);

(b) data link means connected to said transmitter means for receiving the codes created by said encoder means; and (c) receiver means connected to said data link means for receiving said codes generated by said transmitter means and for decoding the data back to a character based data stream.

2. A data transmission system, comprising, in combination:

(a) transmitter means for creating codes as a function of a character based input data stream and including encoder means for encoding each character with a code having a bit length which is an inverse function of the frequency of appearance of the character in a sample of a predetermined number of immediately preceding characters in said data stream;

(b) data link means connected to said transmitter means for receiving the codes created by said encoder means; and (c) receiver means connected to said data link means for receiving said codes generated by said transmitter means and for decoding the data back to a character based data stream, said receiver means including decoder means comprising (i) index guess means for receiving a coded data from said data link means and for computing a hypothetical character index based on the data received;

(ii) histogram reforming means based on a sample of decoded characters for developing a history of such sample, said histogram reforming means having a window identical to a window of said histogram forming means, an index computed by said index guess means being fed to said histogram reforming means;

(iii) power-of-2 frequency estimating means forming an input to said index guess means for developing a power-of-2 frequency q(k) for a coded character; and (iv) comparator means having respective inputs connected to said histogram forming means and said power-of-2 frequency estimating means for sequencing possible characters until q(k')=q(k).

3. Apparatus as defined in claim 2 wherein said bit length means assigns any character k a code of bit length $\beta(k)$, where $\beta(k)$ is the smallest positive integer such that the non-zero probability p(k) of a character appearing is > or = to 1/(2 to the $\beta(k)$ power).

4. A data transmission system, comprising, in combination:
   (a) transmitter means for creating codes as a function of a character based input data stream and including encoder means for encoding each character with a code having a bit length which is an inverse function of the frequency of appearance of the character in a sample of a predetermined number of immediately preceding characters in said data stream, said encoder means including code generating means for receiving said input data stream and for developing a code for each character received, and comprising:
      (i) fractional coding resources means for receiving the input data stream and for determining all characters with a power-of-2 frequency q(k) for a given character;
      (ii) character index means for receiving the character based input data stream and for specifying the position of a given character in an ordered set within the range $\emptyset <$ or $=$ to i(k) $<$ to $\eta(q)-1$, where i(k) is a character index and $\eta(q)$ is a table of the power-of-2 frequencies contained in the incoming data streams;
      (iii) scaler means connected to said character index means and said bit length means for receiving and scaling outputs from same; and
      (iv) summing means connected to said fractional coding resources means and to said scaler means for receiving and summing output signals from same to develope a code for each character contained in the data input stream; and
   bit length means for receiving the same input data stream as said code generating means and for determining from said predetermined number of characters the number of bits of a code to be developed by the code generating means for a specific character k;
   (b) data link means connected to said transmitter means for receiving the codes created by said encoder means; and
   (c) receiver means connected to said data link means for receiving said codes generated by said transmitter means and for decoding the data back to a character based stream.

5. Apparatus as defined in claim 4 wherein said fractional coding resources means includes a table forming means for performing a look-up function of a table $\eta(y)$, where y is a set of all possible power-of-2 frequencies [$\frac{1}{2}$, $\frac{1}{4}$, $\frac{1}{8}$ ..., $\emptyset$].

6. A data transmission system, comprising, in combination:
   (a) transmitter means for creating codes as a function of a character based input data stream and including encoder means for encoding each character with a code having a bit length which is an inverse function of the frequency of appearance of the character in a sample of a predetermined number of immediately preceding characters in said data stream, said encoder means further including code generating means for receiving said input data stream and for developing a code for each character received, and bit length means for receiving the same input data stream as said code generating means and for determining from said predetermined number of characters the number of bits of a code to be developed by the code generating means for a specific character k, said encoder means further including histogram forming means associated with and arranged for receiving the same input data stream as said code generating means and bit length means and for developing a histogrammic analysis of a sample thereof;
   (b) data link means connected to said transmitter means for receiving the codes created by said encoder means; and
   (c) receiver means connected to said data link means for receiving said codes generated by said transmitter means and for decoding the data back to a character based stream.

7. Apparatus as defined in claim 6 wherein the histogram forming means comprises, in combination:
   (a) sample window means for receiving a character based sample of an input data stream containing in sequence the last M characters to appear in the input data stream; and
   (b) character comparing means connected to said sample window means and monitoring the input data stream for comparing the next character, M+1, in the stream with the preceding M characters in said sample window means and generating said histogrammic analysis for character M+1 based on the M characters preceding character M+1.

8. Apparatus as defined in claim 7 wherein said sample window means includes character sequencing means for dropping the first character in the sample sequence of M characters and adding the most recent character, M+1, to the sample sequence to continuously revise the sample sequence of M characters in said sample window means.

9. Apparatus as defined in claim 6 wherein said encoder means further includes probability means connected to said histogram forming means for determining the probability of occurrence of a given character, and power-of-2 frequency means connected to said probability means for determining all power-of-2 frequencies present in the sample and inputting same into said code generator means and said bit length means.

10. Apparatus as defined in claim 9 wherein said probability means comprises divider means for forming a binary fractional frequency, and said power-of-2 frequency means comprises a gating circuit means for changing to zero all decimals to the right of the most significant "1" bit appearing in the binary fraction formed by said divider means.

11. Apparatus as defined in claim 10 wherein said sample window means includes character sequencing means for dropping the first character in the sample sequence of M characters and adding the most recent character, M+1, to continuously revise the sample sequence of M characters in said sample window means.

12. Apparatus as defined in claim 11 wherein said encoder means further includes probability means connected to said histogram forming means for determining the probability of occurrence of a given character, and power-of-2 frequency means connected to said probability means for determining all power-of-2 frequencies present in the sample and inputting same into said code generator means and said bit length means.

13. Apparatus as defined in claim 12 wherein said bit length means assigns any character k a code of bit length $\beta(k)$, where $\beta(k)$ is the smallest positive integer such that the non-zero probability p(k) of a character appearing is > or = to 1/(2 to the $\beta(k)$ power).

14. Apparatus as defined in claim 11 wherein said code generating means includes, in combination:
   (a) fractional coding resources means for receiving the input data stream and for determining all characters of a predetermined frequency;
   (b) character index means for receiving the character based input data stream and for specifying the position of a given character in an ordered set within the range zero $<$ or $=$ to $i(k)$ $<$ or $=$ to $\eta(q)-1$, where $i(k)$ is a character index and $\eta(q)$ is a table of the power-of-2 frequencies contained in the incoming data streams; and
   (c) summing means connected to said fractional coding resources means and said character index means for receiving and summing output signals from same to develope a code for each character contained in the data stream.

15. Apparatus as defined in claim 14 wherein said fractional coding resources means includes a table forming means for performing a look-up function of a table $\eta(y)$, where y is a set of all possible power-of-2 frequencies $[\frac{1}{2}, \frac{1}{4}, \frac{1}{8} \ldots, 0]$.

16. Apparatus as defined in claim 15 wherein said receiver means includes decoder means, comprising, in combination:
   (a) index guess means for receiving a coded data from said data link means and for computing a hypothetical character index based on the data received;
   (b) histogram reforming means based on a sample of decoded characters for developing a history of such sample, said histogram reforming means having a window identical to a window of said histogram forming means, an index computed by said index guess means being fed to said histogram reforming means;
   (c) power-of-2 frequency estimating means forming an input to said index guess means for developing a power-of-2 frequency $q(k)$ for a coded character; and
   (d) comparator means having respective inputs connected to said histogram forming means and said power-of-2 frequency estimating means for sequencing possible characters until $q(k')=q(k)$.

17. Apparatus as defined in claim 16 wherein said decoder means further comprises a comparator unit, and table reforming means partially forming said index guess means and also connected in parallel thereto and to said comparator unit, the output of the comparator unit being $i' \leq \eta(q')$, a multiplexer, and the output of the comparator unit forming one input to said multiplexer, and output of said multiplexer enabling said index guess means until a correct index is computed.

18. Apparatus as defined in claim 16 wherein said comparator means causes a decoded character k to be gated from an input to said histogram forming means when $q(k')=q(k)$.

19. Apparatus as defined in claim 18 wherein said decoder means further comprises a comparator unit, and table reforming means partially forming said index guess means and also connected in parallel thereto and to said comparator unit, the output of the comparator unit being $i'>\eta(q')$, a multiplexer, and the output of the comparator unit forming one input to said multiplexer, and output of said multiplexer enabling said index guess means until a correct index is computed.

20. Apparatus as defined in claim 2 wherein said code generating means includes, in combination:
   (a) fractional coding resources means for receiving the input data stream and for determining all characters of a predetermined frequency;
   (b) character index means for receiving the character based input data stream and for specifying the position of a given character in an ordered set within the range $\emptyset <$ or $=$ to $i(k) >$ or $=$ to $\eta(q)-1$, where $i(k)$ is a character index and $\eta(q)$ is a table of the power-of-2 frequencies contained in the incoming data streams; and
   (c) summing means connected to said fractional coding resources means and said character index means for receiving and summing output signals from same to develope a code for each character contained in the data input stream.

21. Apparatus as defined in claim 2 wherein said code generating means includes, in combination:
   (a) fractional coding resources means for receiving the input data stream and for determining all characters of a predetermined frequency;
   (b) character index means for receiving the character based input data stream and for specifying the position of a given character in an ordered set within the range $\emptyset <$ or $=$ to $i(k) <$ or $=$ to $\eta(q)-1$, where $i(k)$ is a character index and $\eta(q)$ is a table of the power-of-2 frequencies contained in the incoming data streams; and
   (c) summing means connected to said fractional coding resources means and said character index means for receiving and summing output signals from same to develope a code for each character contained in the data input stream.

* * * * *